(12) United States Patent
Hara

(10) Patent No.: US 10,474,200 B2
(45) Date of Patent: Nov. 12, 2019

(54) OPTICAL MODULE HAVING SHIELD STRUCTURE IN FEEDTHROUGH

(71) Applicant: Sumitomo Electric Industries, Ltd., Osaka-shi (JP)

(72) Inventor: Hiroshi Hara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/143,547

(22) Filed: Sep. 27, 2018

(65) Prior Publication Data

US 2019/0094913 A1    Mar. 28, 2019

(30) Foreign Application Priority Data

Sep. 27, 2017    (JP) .................. 2017-186631

(51) Int. Cl.
*G06F 1/16*    (2006.01)
*G02B 6/42*    (2006.01)
*H01L 25/16*   (2006.01)
*H01L 23/532*  (2006.01)
*H01L 23/528*  (2006.01)
*H01L 23/552*  (2006.01)

(52) U.S. Cl.
CPC .......... *G06F 1/1656* (2013.01); *G02B 6/4277* (2013.01); *H01L 23/5286* (2013.01); *H01L 23/53209* (2013.01); *H01L 23/552* (2013.01); *H01L 25/167* (2013.01)

(58) Field of Classification Search
CPC ... G06F 1/1656; G02B 6/4277; H01L 25/167; H01L 23/53209; H01L 23/5286
See application file for complete search history.

(56) References Cited

U.S. PATENT DOCUMENTS

| 4,686,530 A * | 8/1987 | Schneider .............. H04B 10/25 324/120 |
| 6,036,375 A | 3/2000 | Yanagisawa et al. |
| 6,992,250 B2 | 1/2006 | Kubota et al. |
| 2005/0207092 A1 | 9/2005 | Kubota et al. |
| 2019/0094913 A1 | 3/2019 | Hara |

OTHER PUBLICATIONS

Office Action issued in U.S. Appl. No. 16/526,060, dated May 29, 2019.

* cited by examiner

*Primary Examiner* — Seahvosh Nikmanesh
(74) *Attorney, Agent, or Firm* — Baker Botts L.L.P; Michael A. Sartori

(57) ABSTRACT

An optical module that effectively shields EMI noises is disclosed. The optical module of the invention includes a metal housing and a feedthrough. The housing encloses a semiconductor optical device therein and has a rear wall at which the feedthrough is provided. The feedthrough includes an internal portion and an external portion. The internal portion has an upper rear face and a lower rear face. The external portion, which protrudes from the upper rear face and the lower rear face, has a top face having transmission lines and continuous to the upper rear face, a back face continuous to the lower rear face, a rear face, and a pair of side faces, the rear face and the side faces. At least one of the upper rear face, the lower rear face each provided in the internal portion, and the rear face of the external portion has a shield structure.

13 Claims, 18 Drawing Sheets

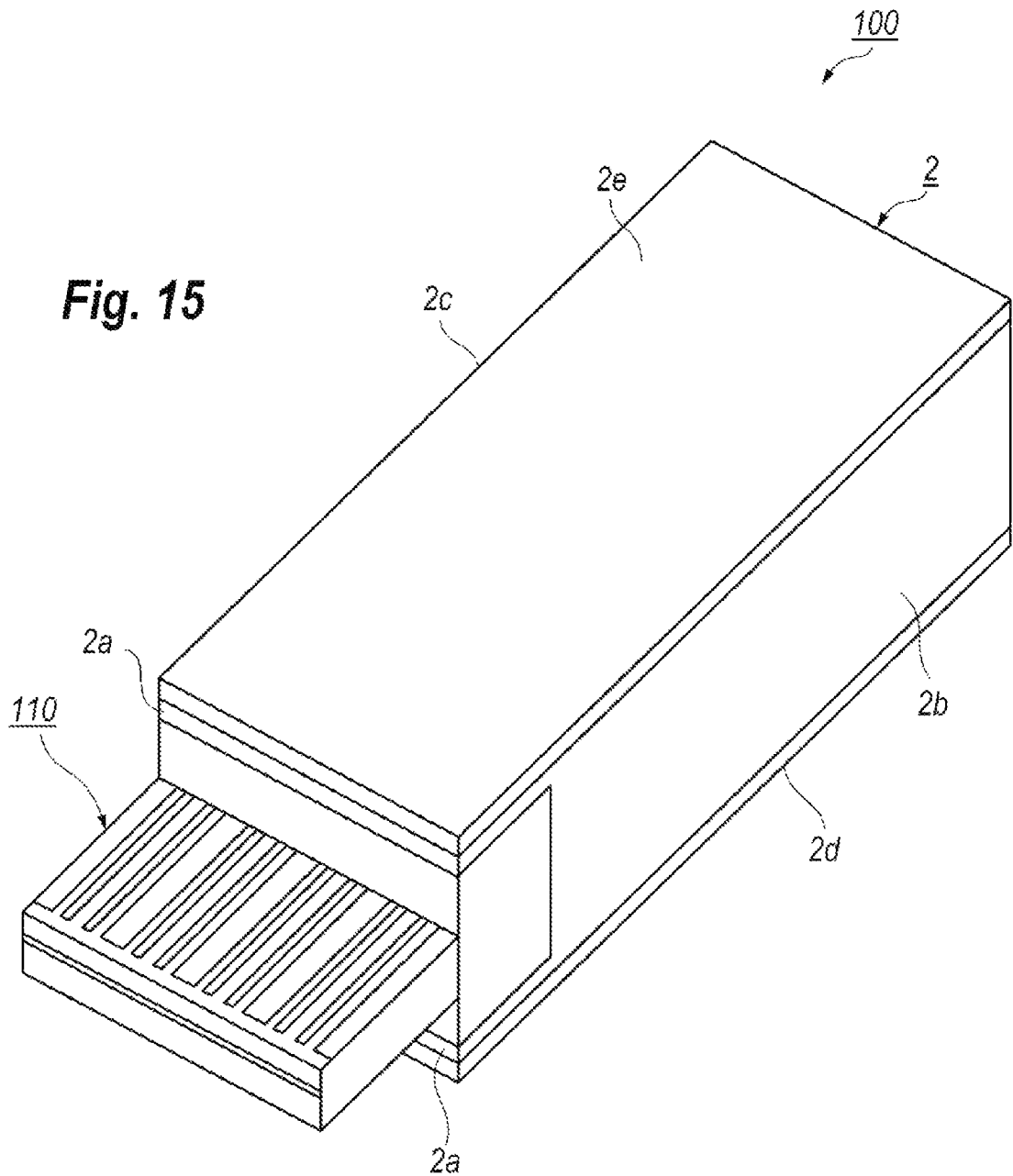

OPTICAL MODULE HAVING SHIELD STRUCTURE IN FEEDTHROUGH

CROSS-REFERENCE TO RELATED APPLICATIONS

The present application is based on and claims the benefit of priority of Japanese Patent Application No. 2017-186631 filed on Sep. 27, 2017, the entire content of which is incorporated herein by reference.

BACKGROUND OF INVENTION

1. Field of Invention

The present invention relates to an optical module, in particular, an optical module having shield structures in feedthrough to eliminate EMI noises from invading within the optical module.

2. Background Arts

A United States Patent US2005/207092A has disclosed an electrical module comprising a base, a frame, and terminals of an input and an output. The base mounts the frame thereon to form a space within which components are mounted on the base. The space is air-tightly shielded by a lid mounted on the frame. The terminals provide interconnections, which connect an outside of the module with an inside thereof, may be a type of transmission line with a configuration of a micro-strip line or a co-planar line. The base, the frame, and the lid may be made of metal, while, the terminals may be primarily made of insulating material.

Another U.S. Pat. No. 6,036,375B has disclosed an optical module providing a package that includes a base, a frame, and a lid to form a space within which a semiconductor optical device is enclosed. The base, which mounts the semiconductor optical device thereon, provides lead terminals for extracting an electrical signal from the semiconductor optical device and/or supplying biases to the semiconductor optical device. The frame, which surrounds the base, provides a hole within which an optical fiber is fixed. The lid is mounted on the frame. Those components of the base, the frame, and the lid may be made of metal.

Recent development in the optical communication system, in particular, an extremely accelerated transmission speed thereof, requests an optical module to have enough tolerance against electro-magnetic interference (EMI) noises. Fully metalized package to enhance the EMI shield function is one of solutions for the subject above. However, even a fully metallized package, a feedthrough, through which high frequency signals and biases are carried, inevitably provides a un-metallized portion. The EMI noises invading through the feedthrough has become a subject to be solved in the high speed optical communication.

SUMMARY OF INVENTION

An aspect of the present invention relates to an optical module that provides a housing and a feedthrough. The housing, which encloses a semiconductor optical device therein, has electrically conductive walls including a rear wall and a pair of side walls each extending from the rear wall. The feedthrough, which is provided in the rear wall of the housing, includes; an internal portion having an upper rear face and a lower rear face, and an external portion protruding from the upper rear face and the lower rear face of the internal portion outwardly. The external portion has a top face, a back face, a rear face, and a pair of side faces, where the top face is continuous to the upper rear face of the internal portion, the back face is continuous to the lower rear face of the internal portion, and the rear face and the side faces connect the top face with the back face. The top face includes transmission lines having signal lines and ground lines. The transmission lines carry high frequency signals for the semiconductor optical device. The back face of the external portion includes ground lines. A feature of the optical module of the present invention is that at least one of the upper rear face, the lower rear face each provided in the internal portion, and the rear face of the external portion has another shield structure.

BRIEF DESCRIPTION OF THE DRAWINGS

The foregoing and other purposes, aspects and advantages will be better understood from the following detailed description of a preferred embodiment of the invention with reference to the drawings, in which:

FIG. 15 is an outer appearance of a conventional optical module including a housing and a feedthrough;

DESCRIPTION OF EMBODIMENTS

Next, embodiment according to the present invention will be described as referring to drawings. The present invention, however, is not restricted to the embodiment and has a scope defined in claims attached and equivalents thereto including all changes and modifications thereof. In the description of the drawings, numerals and symbols same with and similar to each other will refer to elements same with and similar to each other without duplicating explanations.

Figure 1:
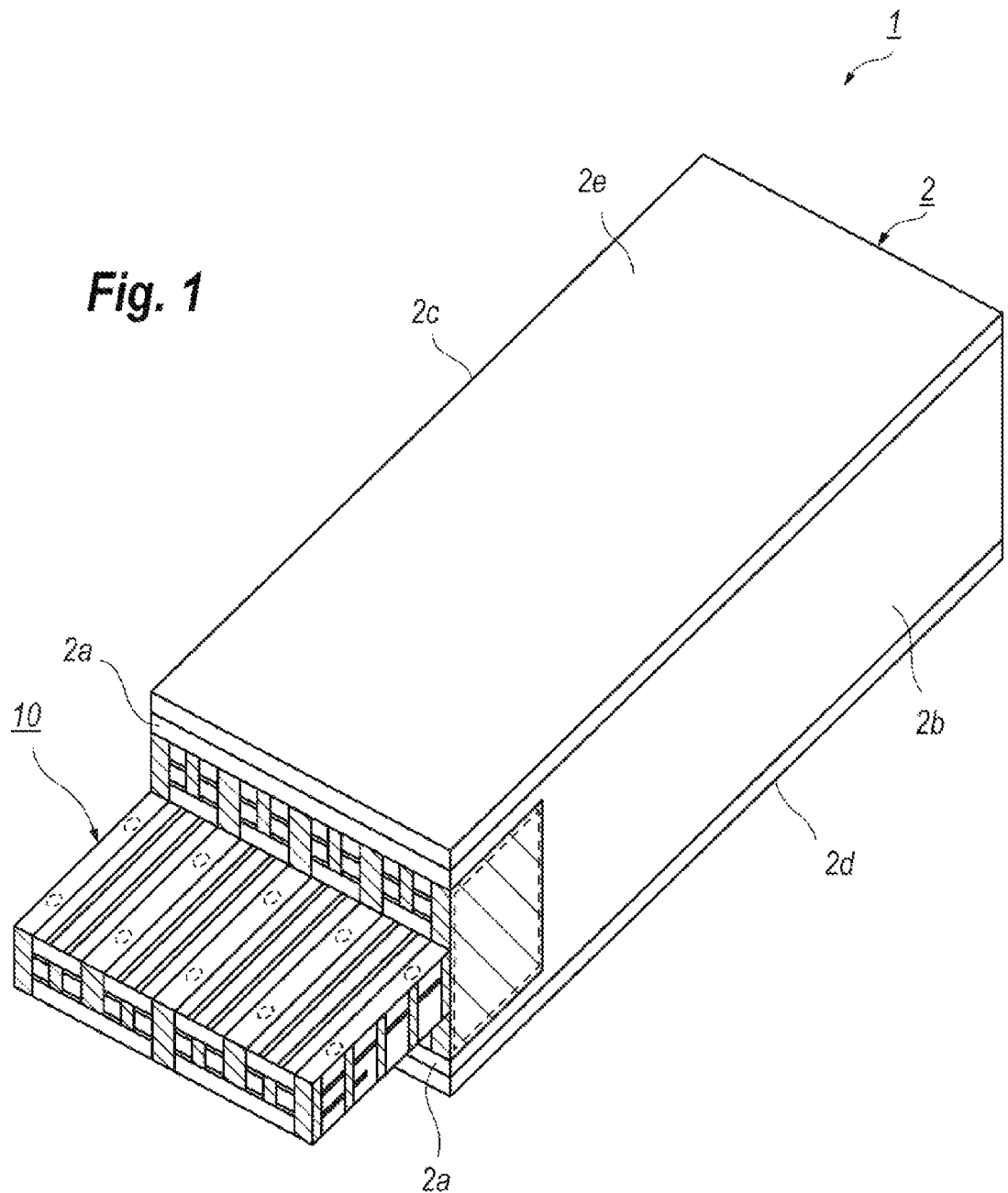
FIG. 1 is an outer appearance of an optical module according to embodiment of the present invention.

FIG. 1 is an outer appearance of an optical module 1 according to embodiment of the present invention. The optical module 1 of the present embodiment, which is a type of a receiver optical sub-assembly (ROSA), includes a box-shaped housing 2 and a feedthrough 10. The housing 2, which may be made of metal, typically Kovar that is alloy of iron (Fe) and nickel (Ni), includes a rear wall 2a, two side walls, 2b and 2c, a bottom 2d, and a lid 2e for forming a space within which electrical and optical components are enclosed. The optical module 1 of the present invention installs four semiconductor optical devices on the bottom 2d that convert optical signals into electrical signals. The walls, 2a to 2c, the bottom 2d, and the lid 2e may be made of metals. In the description below, a direction "rear" corresponds to a side where the feedthrough 10 is provided. Another direction "top" corresponds to a side where the lid 2e is provided; while, another direction of "bottom" corresponds to another side opposite to the top. But those definitions of the directions are presented merely for explanation sake, and could not restrict the scope of the present invention.

Figure 2:
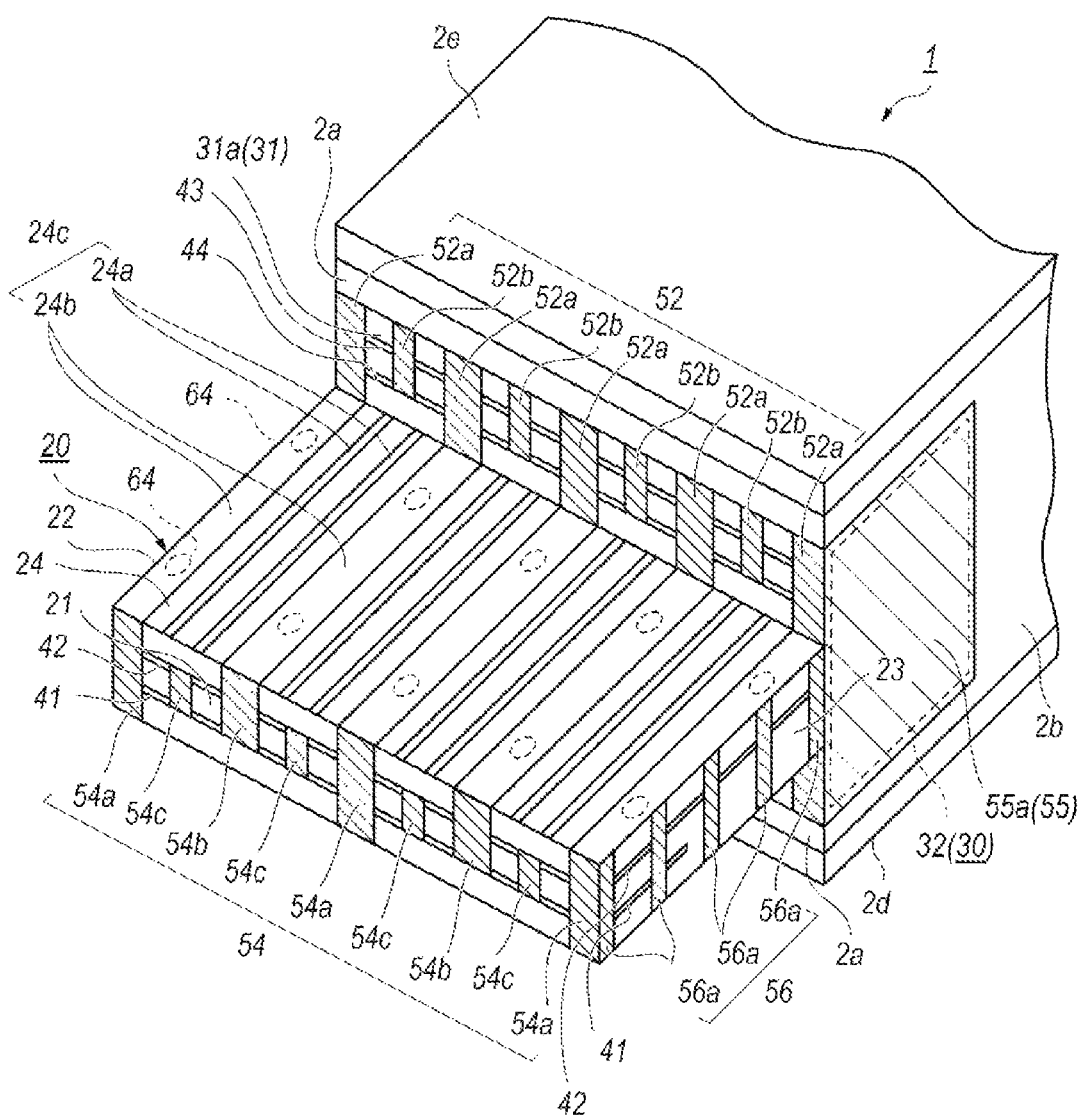
FIG. 2 shows a feedthrough implemented with the optical module, where the feedthrough is viewed from a rear top of the optical module.

The feedthrough 10, which is provided on the bottom 2d and protruding from the rear wall 2a, is provided for extracting electrical signals from the optical module 1 and supplying biases thereto. The feedthrough 10 may be made of dielectric material, such as ceramics. FIG. 2 magnifies the feedthrough 10 viewed from the rear top; while, FIG. 3 also magnifies the feedthrough 10 but viewed from the rear bottom. The feedthrough 10 provides an external portion 20 protruding rearward from the rear wall 2a and an internal portion 30 set within the housing 2.

Figure 3:
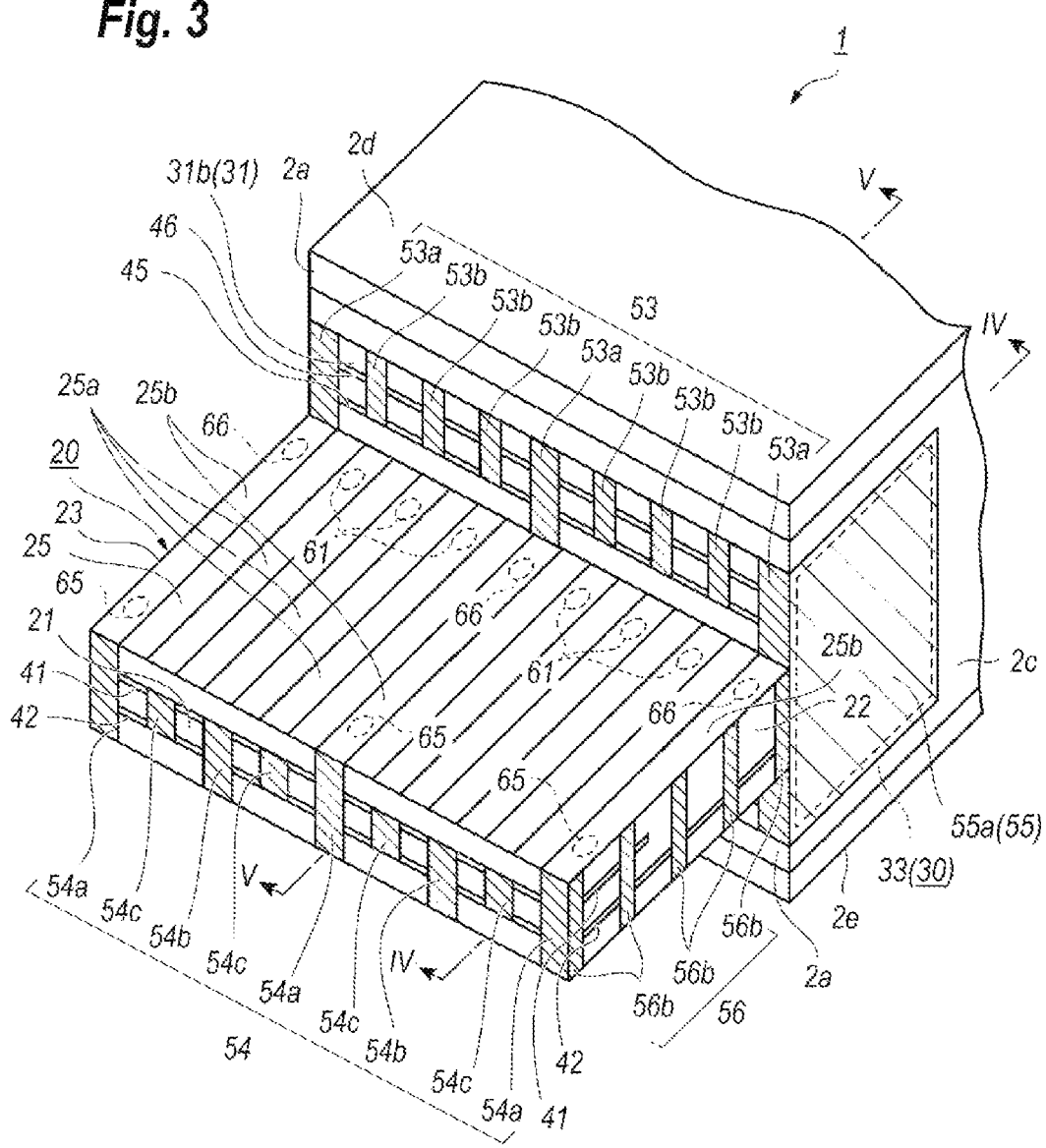
FIG. 3 shows the feedthrough viewed from a rear bottom of the optical module.

As shown in FIG. 2 and FIG. 3, the external portion 20 provides a rear face 21, side faces, 22 and 23, a top face 24, and a back face 25. The top face 24 includes transmission lines 24c each including a pair of signal lines 24a and ground lines 24b sandwiching the signal lines 24a therebetween. Two transmission lines 24b have the ground line common thereto. That is, the transmission lines 24c of the present embodiment each constitute differential transmission lines. The optical module 1 of the present invention provides four transmission lines 24c, the number of which corresponds to the number of the semiconductor optical device implemented within the housing 2. Two ground lines 24b are provided along edges continuous to the side faces, 22 and 23.

The back face 25, as shown in FIG. 3, provides bias lines 25a and ground lines 25b, where the present embodiment provides six bias lines 25a and three ground lines 25b each extending from the rear wall 2a to the rear face 21 of the external portion 20. Specifically, two ground lines 25b are disposed in respective edges continuous to the side faces, 22 and 23, and a rest ground line is disposed in a center of the back face 25. Respective three bias lines 25a are disposed between the ground lines 25b.

The internal portion 30 includes a rear face 31, a side face 32 exposed in the side wall 2b and another side face 33 exposed in the other side wall 2c of the housing 2. Those faces, 31 to 33, are disposed between the bottom 2d and the lid 2e of the housing 2. The external portion 20 protrudes rearward from the rear face 31 of the internal portion 30. The rear face 31 includes an upper rear face 31a between the top face 24 of the external portion 20 and the lid 2e, and a lower rear face 31b provided between the back face 25 of the external portion 20 and the bottom 2d. The side faces, 32 and 33, are fully included within the respective side walls 2b and 2c.

The external portion 20 includes two ground layers, 41 and 42, between the top and back faces, 24 and 25; while, the internal portion 30 includes upper ground layers, 43 and 44, between the external portion 20 and the lid 2e, and lower ground layers, 45 and 46, between the external portion 20 and the bottom 2d. The former two ground layers, 41 and 42, extend within the external portion 30 from the rear face 21; while, the ground layers, 43 and 44, extend within the internal portion 30 from the upper rear face 31a, and the rest ground layers, 45 and 46, extend within the internal portion 30 from the lower rear face 31b. The ground layer 42 is electrically connected with the ground layer 41 and ground lines 24b through vias 64. The ground layers, 41 and 42, expose from the respective side faces, 22 and 23. The ground layers, 43 and 44, expose in the upper rear face 31a, while, the ground layers, 45 and 46, expose in the lower rear face 31b.

Figure 4:
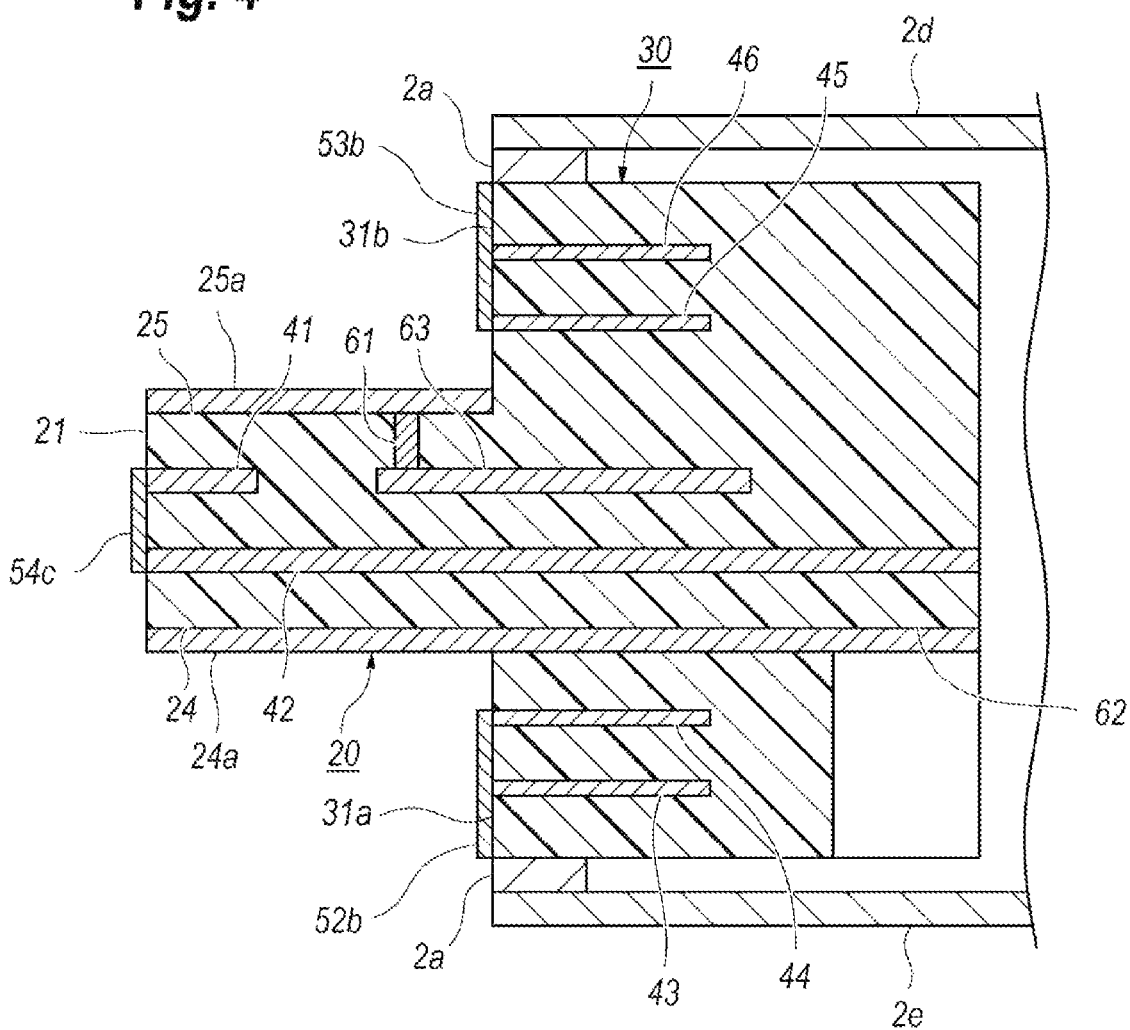
FIG. 4 is a cross sectional view of the feedthrough taken along a line IV-IV indicated in FIG. 3.
Figure 5:
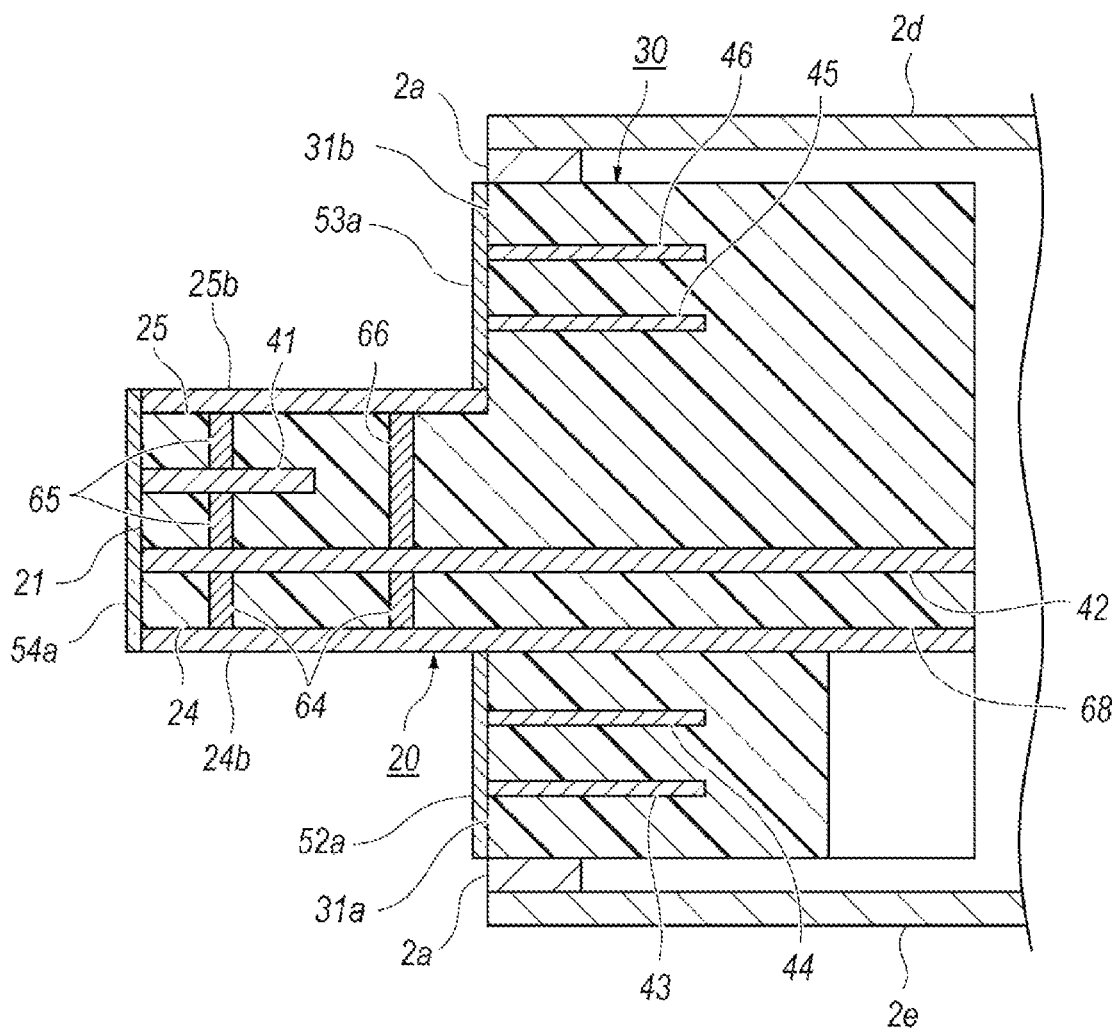
FIG. 5 is a cross sectional view of the feedthrough taken along a line V-V indicated in FIG. 3.

FIG. 4 is a cross sectional view of the feedthrough 20 that is taken along the line IV-IV indicated in FIG. 3; that is, the cross sectional view taken along one of the bias lines 25a. FIG. 5 is also a cross sectional view of the feedthrough 10 taken along the line V-V indicated in FIG. 3, that is, a cross sectional view of the feedthrough 10 taken along one of the ground lines 25b. The bias lines 25a in the external portion 20 are connected with respective DC (direct current) lines in the housing 2 through vias 61 and interconnections 63. The DC lines carry signals corresponding to a temperature, sensed optical power, bias supplies for respective semiconductor optical devices, and so on. The interconnections 63 are disposed between the ground layer 42 and the back face 25 but within a virtual plane common to the ground layer 41 but electrically isolated therefrom. The transmission lines 24c in the top face 24, exactly, the signal lines 24a and the ground lines 24b extend within the internal portion 30, where the signal lines 24a become interconnections 62 there.

Referring to FIG. 2 and FIG. 3 again, the external portion 20 further includes a shield structure 54 including first to third metal films, 54a to 54c, and the ground layers, 41 and 42, in the rear face 21 thereof and another shield structure 56 including metal films, 56a and 56b, and the ground layers, 41 and 42, exposed in the side faces, 22 and 23. The metal films 54a to 54c, 56a and 56b, may include gold (Au). The internal portion 30 also includes still another shield structures, namely, an upper rear shield 52, a lower rear shield 53, and side shields 55. The upper rear shield 52 includes first and second metal films, 52a and 52b, and ground layers, 43 and 44 in the upper rear face 31a. The lower rear shield 53 includes first and second metal films 53a and 53b, and the ground layers, 45 and 46, in the lower rear face 31b. The side shields 55 include metal films 55a in the respective sides, 31 and 32. The metal films, 52a and 52b, 53a and 53b, 54a to 54c, and 55a may also include gold (Au).

Specifically, the first metal films 54a in the rear shield 54, which extend from the top face 24 to the back face 25 as connecting the ground layers, 41 and 42, are connected with the ground lines 24b in the top face 24 and the ground lines 25b in the back face 25. The second metal films 54b, which extend from the top face 24 to the ground layer 41, are connected with the ground lines 24b in the top face 24 but apart from the ground lines 25b in the back face 25. The third metal films 54c extend between the ground layers, 41 and 42, but apart from the ground lines, 24b and 25b. The third metal films 54c, which extend between ground layers, 41 and 42, are put between the first and second metal films, 54a and 54b. In other words, the second metal films 54b are arranged between the third metal films 54c, and the second and third metal films, 54b and 54c, are arranged between the first metal films 54a. Those metal films, 54a to 54c, are arranged with a distance therebetween of, for instance, 1 mm, but preferably shorter than 0.5 mm. Thus, the first to third metal films, 54a to 54c, and the ground layers, 41 and 42, form a meshed ground pattern on the rear face 21 of the external portion 20.

The metal films, 56a and 56b, in the shield structure 56, which extend from the top face 24 to the back face 25 of the external portion 20, are connected with the ground lines 24b arranged outermost in the top face 24 and the ground lines 25b arranged outermost in the back face 25 as connecting the ground layers, 41 and 42 in the respective side faces, 22 and 23. The metal films 56a form gaps therebetween with a distance of, for instance, around 1 mm preferably shorter than 0.5 mm. Thus, the metal films, 56a and 56b, and the ground layers, 41 and 42, form meshed ground patterns in the respective side faces, 22 and 23.

The first metal films 52a in the upper rear shield 52, which extend from the external portion 20 to an end of the internal portion 30 in the side of the lid 2e as connecting the ground layers, 43 and 44, are connected with the respective ground lines 24b. The second metal films 52b in the upper rear shield 52 are extended between the ground layers, 43 and 44, but apart from the signal lines, 24a. Thus, the first and second metal films, 52a and 52b, and the ground layers, 43 and 44, form a meshed ground pattern on the upper rear face 31a.

The first metal films 53a in the lower rear shield 53, which extend from the external portion 20 to a bottom of the internal portion 30, are connected with the ground lines 25b in the back face 25 of the external portion 20. The second metal films 53b extend from the ground layer 45 to the bottom of the internal portion 30 but apart from the bias lines 25a. The first and second metal films, 53a and 53b, which are arranged corresponding to the ground lines 25b and the bias lines 25a on the back face 25, secure a gap therebetween of, for instance, 1 mm but preferably shorter than 0.5 mm. Thus, the first and second metal films, 53a and 53b, and the ground layers, 45 and 46, form a meshed ground pattern on the lower rear face 31b.

The side shield 55, which is provided in at least one of the side faces, 32 and 33, in the internal portion 30, includes the metal film 55a. The present embodiment of the optical module 1 provides the side shields 55 in both side faces, 32 and 33, of the internal portion 30, and the metal films 55a fully cover the side faces, 32 and 33.

Referring FIG. 5, the ground lines 24b in the top face 24 are connected with the ground lines 25b in the back face 25 through vias, 64 to 66. Specifically, the ground lines 24b in the top face 24 are connected with the ground layer 42 through the vias 64. The ground lines 25b in the back face 25 are connected with the ground layer 42 through the vias 66 in a portion closer to the internal portion 30, and the other ground layer 41 through the vias 65 in a portion closer to the rear face 21.

Advantages of the housing 2 of the optical module 1 of the present embodiment, in particular, advantages of the feedthrough 10 will be described comparing with a conventional optical module. Recent optical communication system extremely increases the transmission speed thereof, which reaches 50 gaga-bit per seconds (Gbps) or sometimes exceeds 100 Gbps. In such a system, electro-magnetic interference (EMI) noises become a fatal subject. In particular, an optical transmitting module, which is driven by an electrical signal including extremely high frequency components, possibly becomes an EMI noise source. An optical module, which converts an optical signal into an electrical signal, is often arranged with an optical transmitter module in side by side. Accordingly, such an optical module is influenced from EMI noises generated in an optical transmitter module.

Figure 16A:
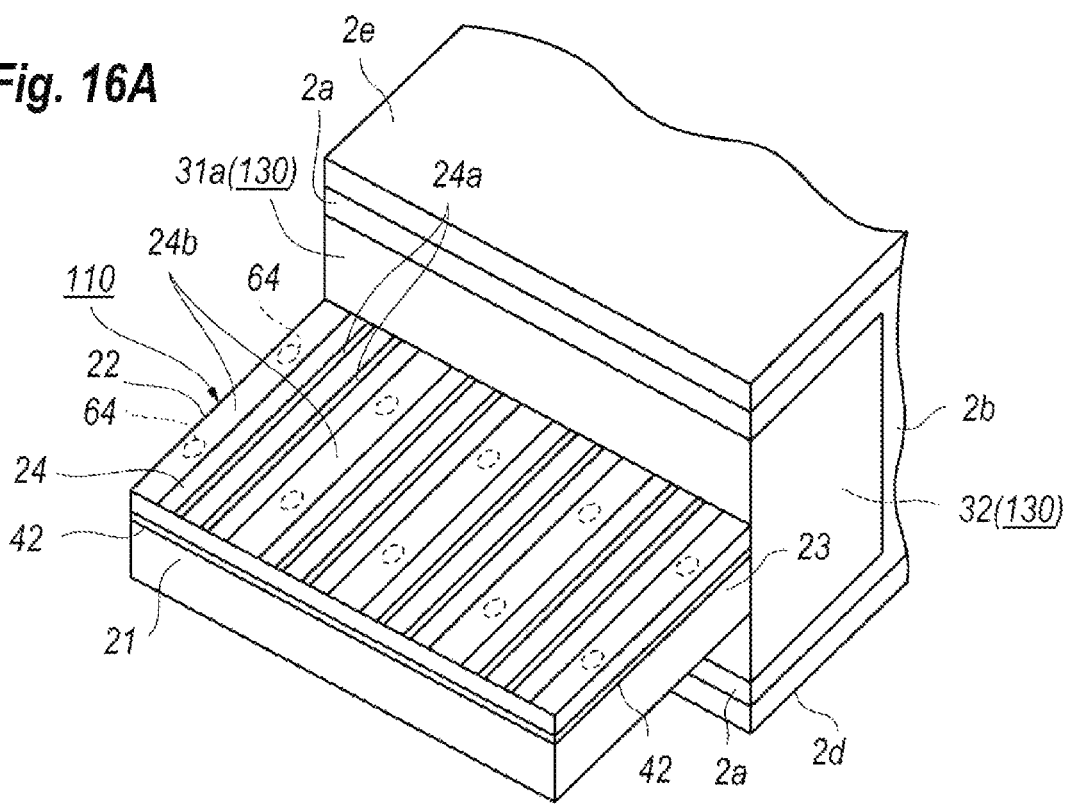
FIG. 16A magnifies the feedthrough in the optical module shown in FIG. 15, which is viewed from the rear top of the housing, and FIG. 16B also magnifies the feedthrough viewed from the rear bottom of the housing.
Figure 16B:
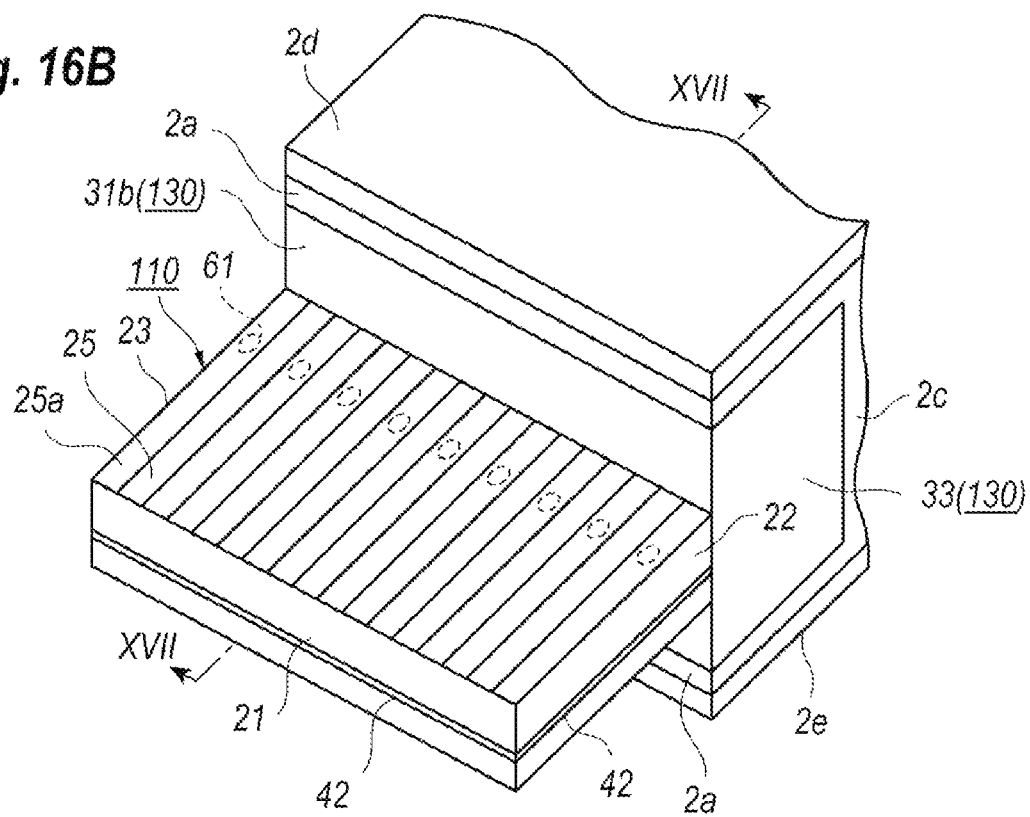
Figure 17:
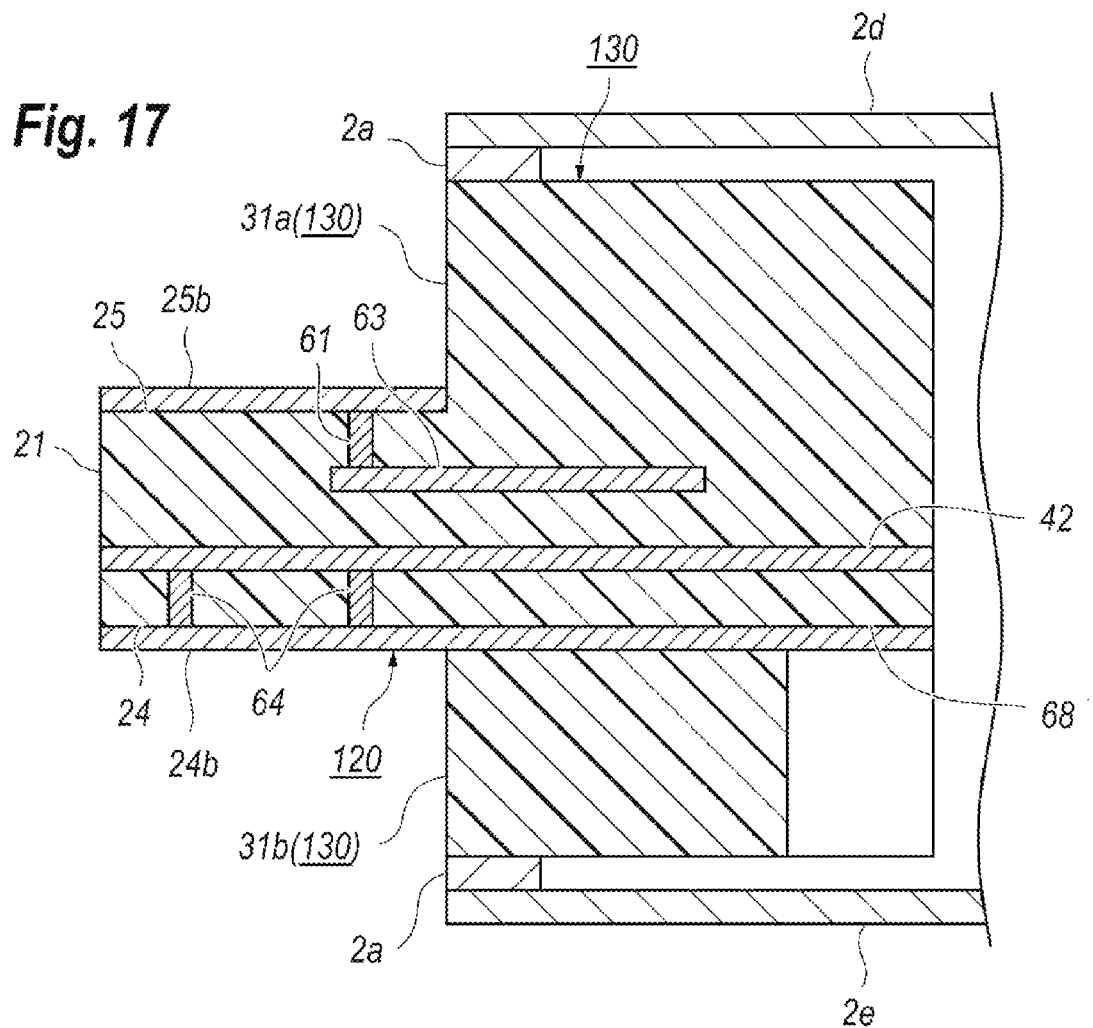
FIG. 17 is a cross sectional view of the feedthrough shown in FIG. 15 taken along the line XVII-XVII indicated in FIG. 16B.
Figure 18:
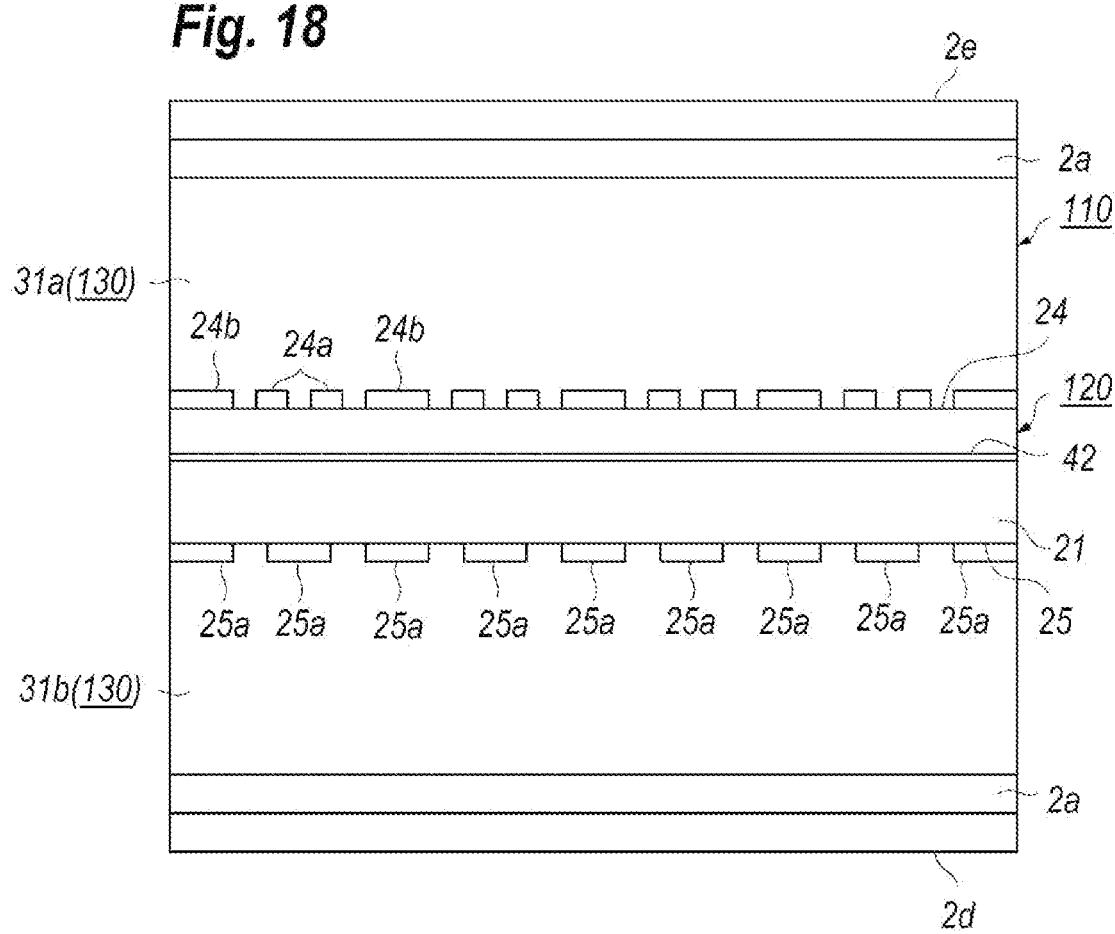
FIG. 18 is a rear view of the feedthrough shown in FIG. 15.

FIG. 15 is an outer appearance of a conventional optical module 100 including a housing 2 and a feedthrough 110; FIG. 16A magnifies the feedthrough 110 viewed from the rear top of the housing 2, while, FIG. 16B also magnifies the feedthrough 110 viewed from the rear bottom of the housing 2; FIG. 17 is a cross sectional view of the feedthrough 110 taken along the line XVII-XVII indicated in FIG. 16B; and FIG. 18 is a rear view of the feedthrough 110. The optical module 100 has a feature distinguishable from the optical module 1 of the present embodiment that the feedthrough 110 provides no shield structures. Accordingly, the housing 2, which may be made of metal, may effectively shield EMI noises generated outside of the housing 2; however, the feedthrough 110 becomes substantially transparent for the those EMI noises.

Specifically, the EMI noises may invade within the housing 2 through any of the upper and lower rear faces, 31a and 31b, the side faces, 32 and 33, of the internal portion 130, the rear face 21 and the side faces, 22 and 23, of the external portion 120. Comparing with the arrangement of the present embodiment shown in FIG. 4, the rear face 21, the upper rear face 31a, and the lower rear face 31b provide no metal films. Moreover, the upper and lower rear faces, 31a and 31b, of the internal portion 130 provide no ground layers, and the rear face 21 provides no additional ground layer in a portion extending to the interconnections 63. Thus, the EMI noises easily penetrate within the housing 2.

On the other hand, the optical module 1 of the present embodiment provides many shield structures, 52 to 56, in the external portion 20 and the internal portion 30 of the feedthrough 10, where those shield structures are connected with the ground layers, 41 to 44, so as to form the meshed ground patterns. Also, the ground lines, 24b and 25b, in the top face 24 and the back face 25 of the external portion 20 are connected to the meshed ground patterns in the shield structure 54. Moreover, those shield structures, 52 to 56, are grounded through the metal base 2d. Thus, the housing 2 of the present embodiment may effectively prevent the EMI noises from invading within the housing 2.

The shield structure 54 may provide the metal films, 54a to 54c, vertically extending in the rear face 21 as connecting the ground layers, 41 and 42, with the ground lines, 24b and 25b. The shield structure 52 may include the metal films, 52a and 52b, vertically extending in the rear upper face 31a of the internal portion 30 as connecting the ground layers, 43 and 44, with the ground lines 24b. The shield structure 53 may include the metal films, 53*a* and 53*b*, vertically extending in the lower rear face 31*b* as connecting the ground layers, 45 and 46, with the ground lines 25*b*. The shield structure 56 in the side faces, 22 and 23, may include the metal films, 56*a* and 56*b*, respectively, as connecting the ground layers, 41 and 42, with the ground lines, 24*b* and 25*b*. Also, the shield structure 55 in the respective side faces, 32 and 33, of the internal portion 30 may include the metal films 55*a* connecting the ground layers, 43 to 46.

The ground layers, 41 and 42, in the external portion 20 may be connected with the ground lines, 24*b* and 25*b*, through the vias, 64 and 65, at the portion closer to the rear face 21, while, through the vias 64 at the opposite portion closer to the internal portion 30. The ground layer 41 may extend within the external portion 20 so as not to be in contact with the interconnections 63 that carry the bias signals. The ground layer 42 may deeply extend within the external portion 20 and the internal portion 30, that is, the ground layer 42 fully passes the feedthrough 10. The ground layers, 43 to 46, may extend within the internal portion 30 but not fully pass the internal portion.

[First Modification]

Figure 6:
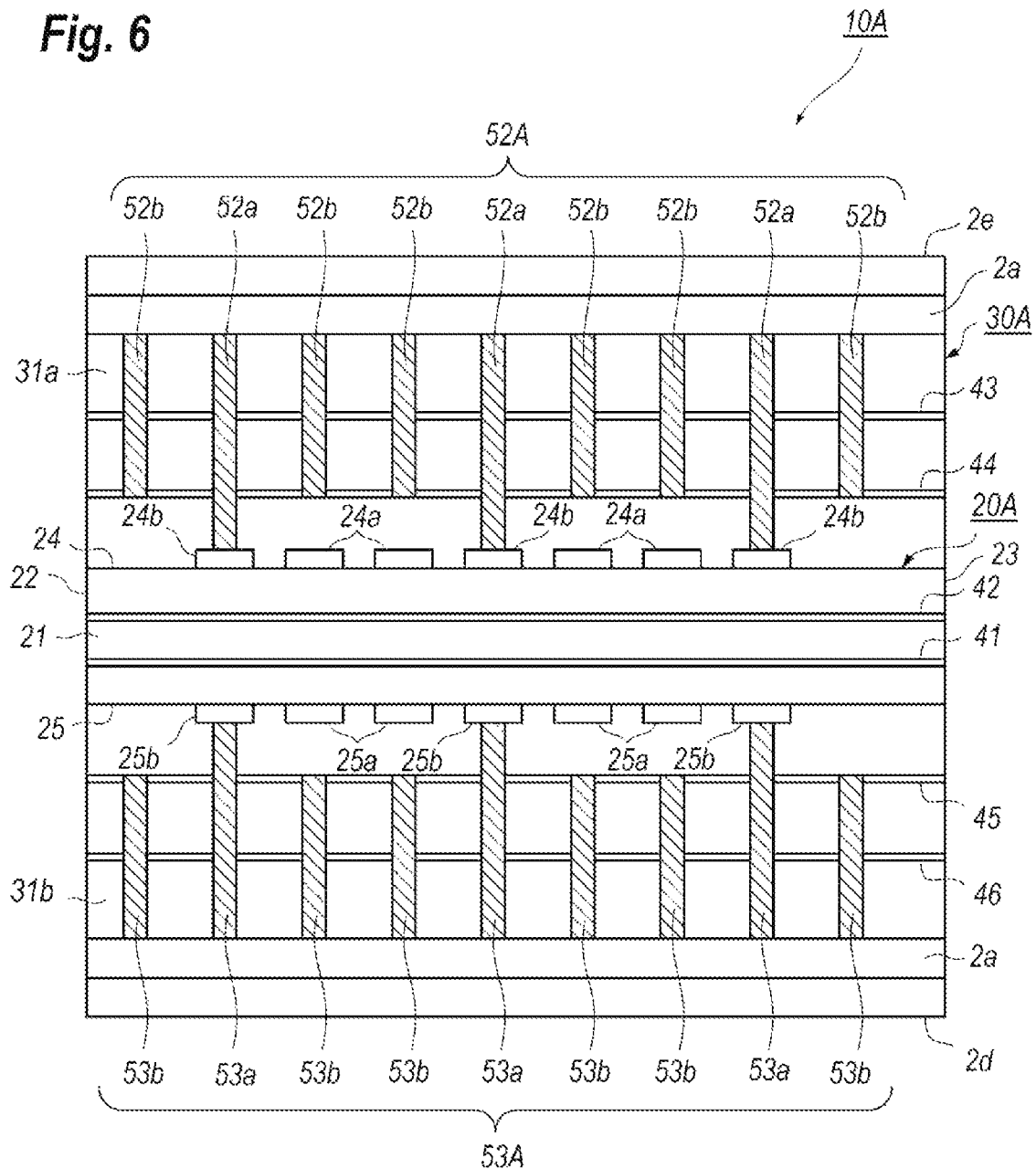
FIG. 6 is a rear view of a feedthrough modified from the feedthrough shown in FIG. 2 to FIG. 5.

FIG. 6 is a rear view of the feedthrough 10A modified from the aforementioned feedthrough 10. The modified feedthrough 10A shown in FIG. 6 has a feature that the modified feedthrough 10A provides no shield structure in the rear face 21 of the external portion 20A. As shown in FIG. 6, the top face 24 in respective edges thereof provides no ground lines 24*b*. The outermost ground lines 24*b* are retreated from the edges of the top face 24. Also, the back face 25 of the external portion 20A provides the ground lines 25*b* in positions reflecting the positions of the ground lines 24*b* in the top face 24. Accordingly, the modified feedthrough 10A provides no shield structure in the side faces, 32 and 33.

The first metal films 52*a* in the upper rear face 31*a* correspond to the ground lines 24*b*. The first metal films 52*a* put two second metal films 52*b* therebetween; that is, the first metal films 52*a* are put between the second metal films 52*b*. The second metal films 52*b* are disposed corresponding to the signal lines 24*a* on the top face 24. The first metal films 53*a* in the lower rear face 31*b* correspond to the ground lines 25*b* and put two second metal films 53*b* therebetween. That is, the first metal film 53*a* is put between the second metal films 53*b*. The second metal films 53*b* are disposed corresponding to the bias lines 25*a*. Thus, the first and second metal films, 52*a* and 52*b*, in the upper rear face 31*a*, and the first and second metal films, 53*a* and 53*b*, in the lower rear face 31*b* may form the meshed ground pattern combined with the ground layers, 43 and 44, in the upper rear face 31*a*, and another meshed ground pattern combined with the ground layers, 45 and 46, in the lower rear face 31*b*. Such meshed ground patterns may effectively prevent the EMI noises from invading within the housing 2.

[Second Modification]

Figure 7:
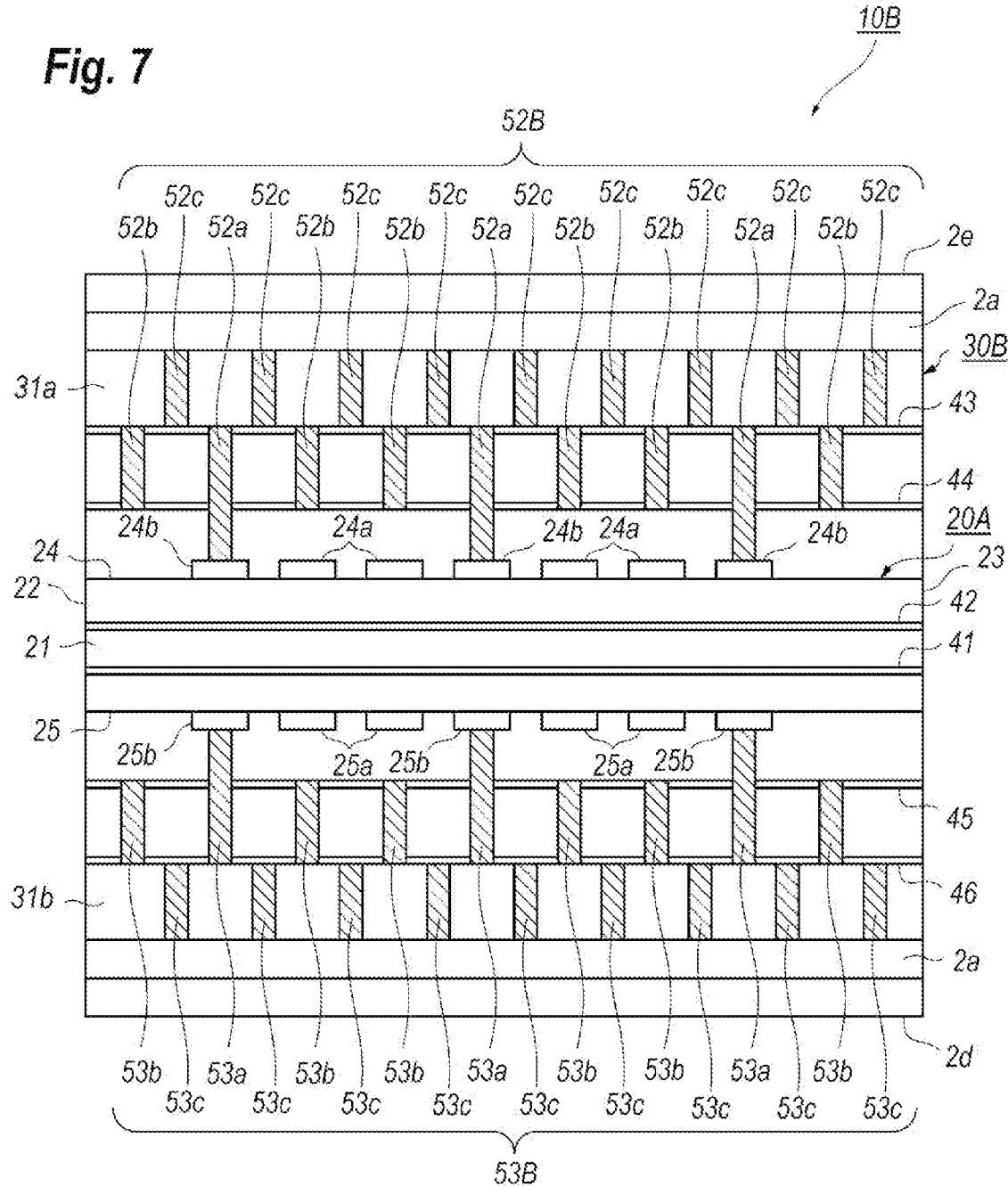
FIG. 7 is a rear view of another feedthrough still modified from that shown in FIG. 2 to FIG. 5.

FIG. 7 is a rear view of another modified feedthrough 10B. The feedthrough 10B shown in FIG. 7 has a feature that the external portion 20A thereof is substantially same with that of the former feedthrough 10A but the internal portion 30B thereof, in particular, the upper rear face 31*a* and the lower rear face 31*b* has the shield structures, 52B and 53B, different from those of the former modified feedthrough 10A. Specifically, the shield structure 52B provides first to third metal films, 52*a* to 52*c*, where the first metal films 52*a* extend from the ground lines 24*b* to the ground layer 43, the second metal films 52*b* extend between the ground layers, 43 and 44, and the third metal films 52*c* extend from the ground layer 43 to the upper end of the internal portion 30B in the side of the lid 2*e*. The other shield structure 53B in the lower rear face 31*b* provides the metal films, 53*a* to 53*c*, substantially same arrangements with those of the upper rear shield 52B. In the upper and lower rear shield structures, 52B and 53B, the first metal films, 52*a* and 53*a*, are in contact with the ground lines, 24*b* and 25*b*, but the second metal films, 52*b* and 53*b*, are apart from the signal lines 24*a* and the bias lines 25*a*, respectively. Thus, the upper and lower rear faces, 31*a* and 31*b*, may provide the meshed ground patterns that effectively prevent the EMI noises from invading within the housing 2.

[Third Modification]

Figure 8:
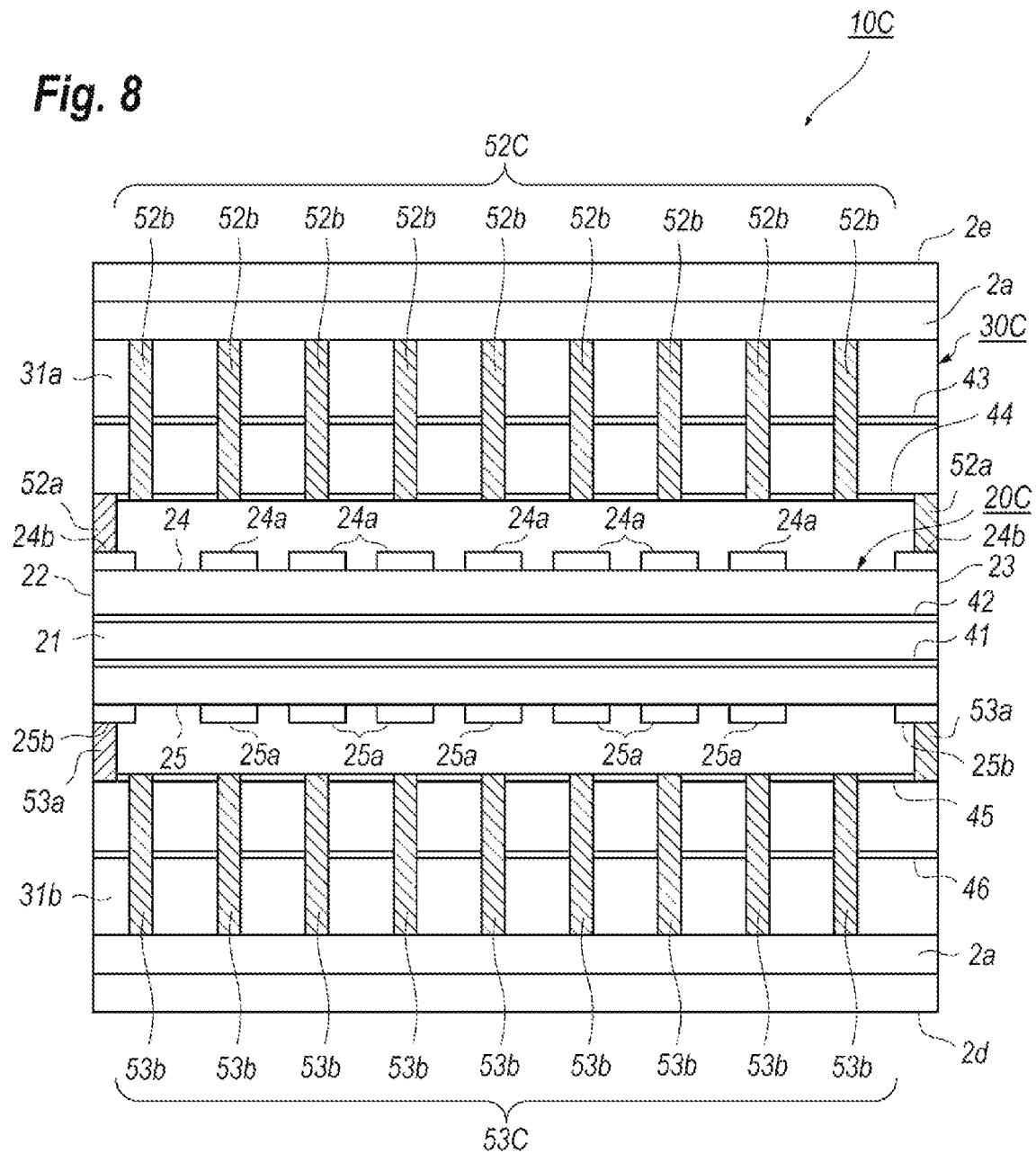
FIG. 8 is a rear view of still another modified feedthrough.

FIG. 8 is a rear view of the feedthrough 10C according to still another modification of the embodiment. The feedthrough 10C shown in FIG. 8 has an arrangement in the rear face 21 of the external portion 20C same with that in the former modification 20A, that is, no metal films connecting the ground layers, 41 and 42, are provided there, but has a feature distinguishable from those aforementioned feedthroughs, 10 to 10B, that the top and back faces, 24 and 25, provide the ground lines, 24*b* and 25*b*, only in respective sides thereof but omits those provided in the centers. The centers of the top and back faces, 24 and 25, provide an additional signal line 24*a* and an additional bias line 25*a*. That is, the ground lines 24*b* in the respective sides of the top face 24 put the signal lines 24*a* but no ground lines therebetween, and the ground lines 25*b* also in the respective sides of the back face 25 put the bias lines 25*a* but no ground lines therebetween. Moreover, the metal films 52*a* provided only in respective sides of the upper rear face 31*a* connect the ground lines 24*b* with the ground layer 44; while, the metal films 53*a* provided also only in respective sides of the lower rear face 31*b* connect the ground lines 25*b* with the ground layer 45. In the upper rear face 31*a*, the metal films 52*b* extend from the ground layer 44 to the top end of the internal portion 30C but apart from the signal lines 24*a* in the top face 24 of the external portion 20C. Also, the lower rear face 31*b* provides the metal films 53*b* extending from the ground lines 45 to the lower end of the internal portion 30C but apart from the bias lines 25*a* in the back face 25 of the external portion 20C. Even such an arrangement of the upper and lower rear faces, 31*a* and 31*b*, in the internal portion 30C, the EMI noises may be effectively prevented from invading within the housing 2 through the feedthrough 10C.

[Fourth Modification]

Figure 9:
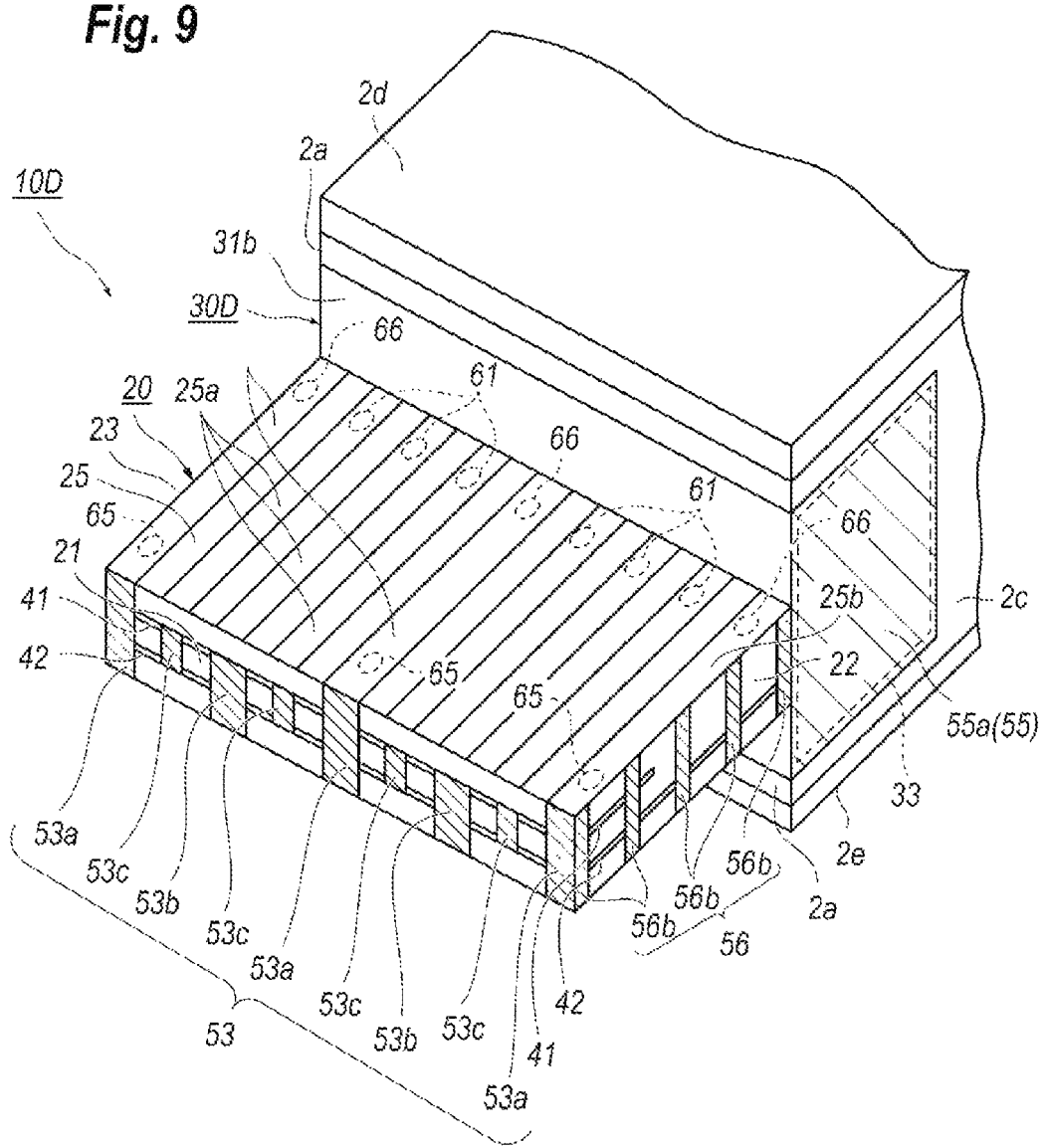
FIG. 9 is a perspective drawing of another feedthrough viewed from the rear bottom of the housing according to the second modification of the embodiment.

FIG. 9 is a perspective drawing of another feedthrough 10D viewed from rear bottom of the housing 2 according to the fourth modification of the embodiment. The modified feedthrough 10D shown in FIG. 9 has a feature that the rear face 31 of the internal portion 30D has no ground layers and no metal films connecting the ground layers. That is, the internal portion 30D in the sides, 32 and 33, thereof provides the shield structures 55 including metal films 55*a* but the upper rear face 31*a* and the lower rear faces 31*b* has no shield structures, 52 and 53, and no ground layers, 43 to 46. Even such an arrangement in the internal portion 30D, the EMI noises may be effectively prevented from invading within the housing through the feedthrough 10D.

[Fifth Modification]

Figure 10:
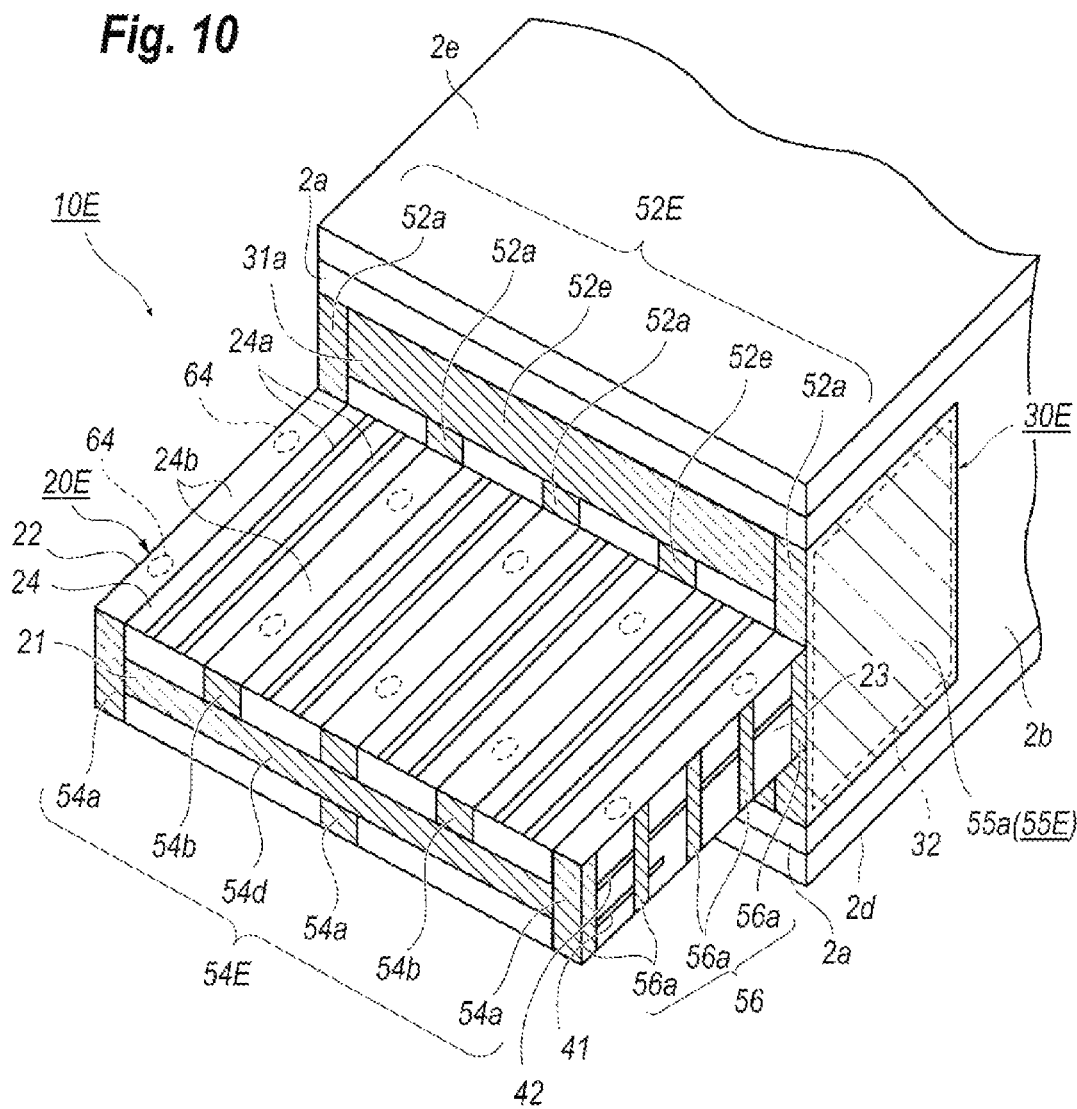
FIG. 10 is a perspective drawing of still another feedthrough according to the third modification of the embodiment, which is viewed from the rear top of the housing.
Figure 11:
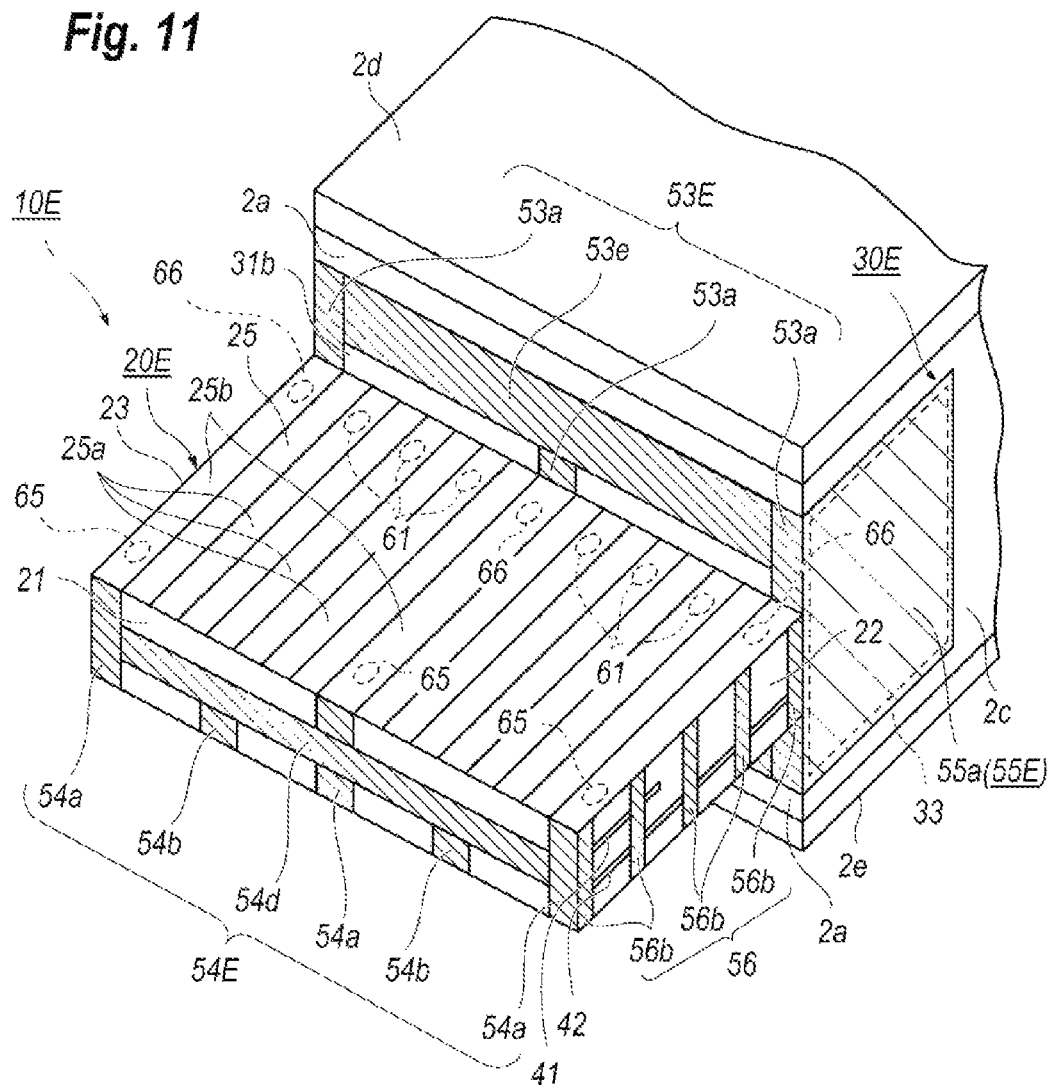
FIG. 11 is also a perspective drawing of the feedthrough but viewed from the rear bottom of the housing.

FIG. 10 is a perspective drawing of still another feedthrough 10E according to the fifth modification of the embodiment, which is viewed from rear top of the housing 2; and FIG. 11 is also a perspective drawing of the feedthrough 10E but viewed from rear bottom of the housing 2. The feedthrough 10E shown in FIG. 10 and FIG. 11 has a feature distinguishable from those aforementioned feedthroughs, 10 to 10D, that the rear face 21 of the external portion 20E and the rear face 31 of the internal portion 30E provide other shield structures. That is, the rear face 21 of the external portion 20E provides the shield structure 54E including metal films, 54a and 54b, and an additional metal film 54d. The first metal films 54a extend from the top face 24 to the back face 25; while, the second metal films 54b extend from the top face 24 to an intermediate of the rear face 21. The additional metal film 24d extends from one side 22 to the other side 23 in a lateral direction of the housing and extends between the ground layers, 41 and 42, as connecting the metal films, 54a and 54b. Thus, the rear face 21 of the external portion 10E provides the meshed ground pattern.

The lower rear face 31b provides the shield structure 53E including metal films, 53a and 53e, and the ground layers, 45 and 46. The metal film 53e extends from one side 32 to the other side 33 as connecting the ground layers, 45 and 46. The metal films 53a, which are provided in the respective sides and the center of the upper rear face 31, are connected with the ground lines 25b on the back face 25 of the external portion 20E. Although not explicitly illustrated in FIG. 11, the upper rear face 31a provides substantially same arrangements in the metal films and the ground layers. Thus, the rear face 31 of the internal portion 30E provides the meshed ground patterns that effectively prevent the EMI noises from invading within the housing 2 through the feedthrough 10E.

[Sixth Modification]

Figure 12:
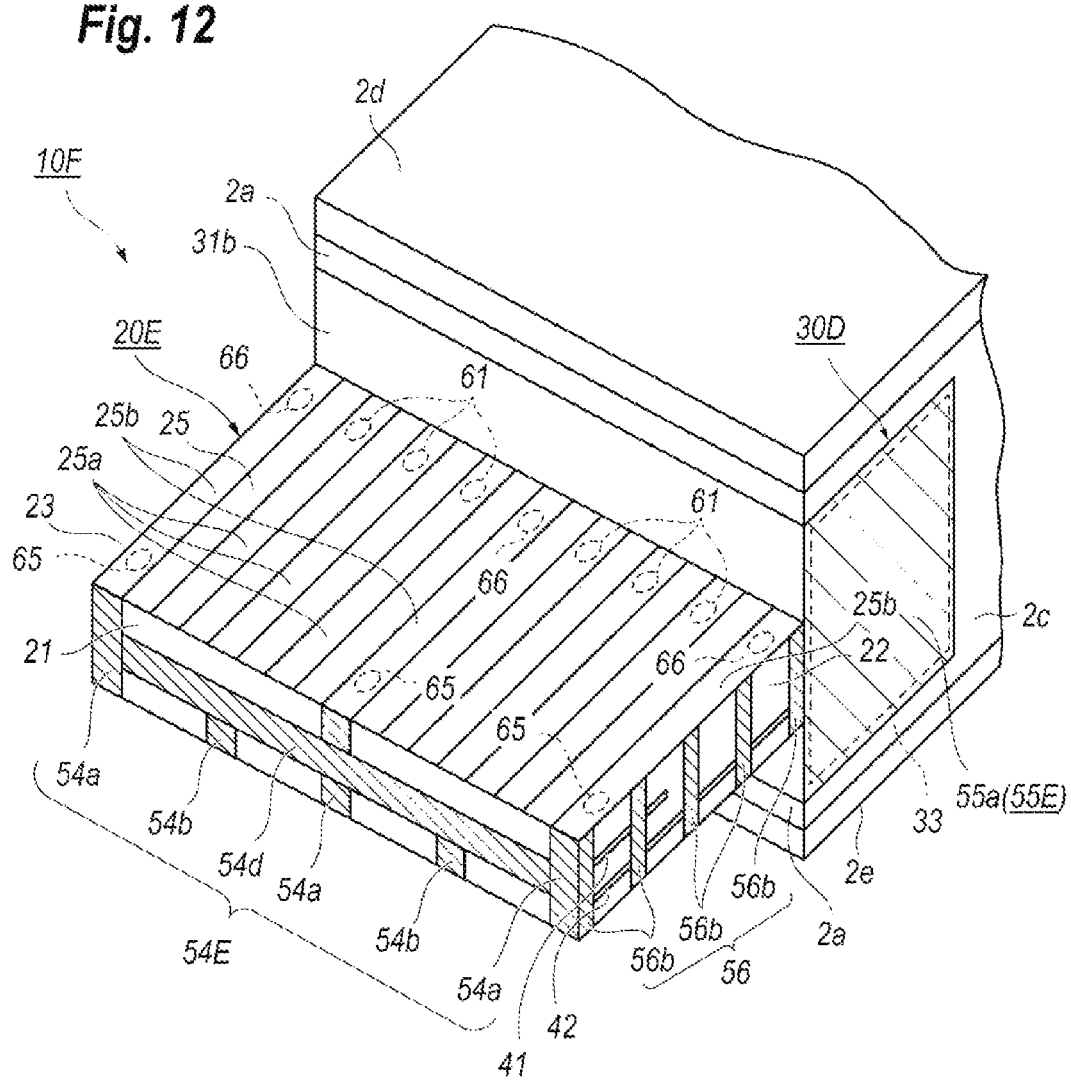
FIG. 12 is a perspective drawing of still another feedthrough viewed from the rear bottom of the housing, where the feedthrough in FIG. 12 is further modified from that shown in FIG. 10 and FIG. 11.

FIG. 12 is a perspective drawing of still another feedthrough 10F that is further modified from that shown in FIG. 10 and FIG. 11. The feedthrough 10F shown in FIG. 12 has a feature that the rear face 31 of the internal portion 30D omits the shield structures provided in the aforementioned feedthrough 10E. That is, the feedthrough 10F provides the external portion 20E having same arrangement in the meshed ground pattern with that of the former feedthrough 10E; but the internal portion 30D having the shield structure same with that implemented in the aforementioned feedthrough 10D illustrated in FIG. 9. Even such an arrangement in the shield structures implemented in the external portion 20E and the internal portion 30D may effectively prevent the EMI noises from invading within the housing 2 through the feedthrough 10F.

[Seventh Modification]

Figure 13:
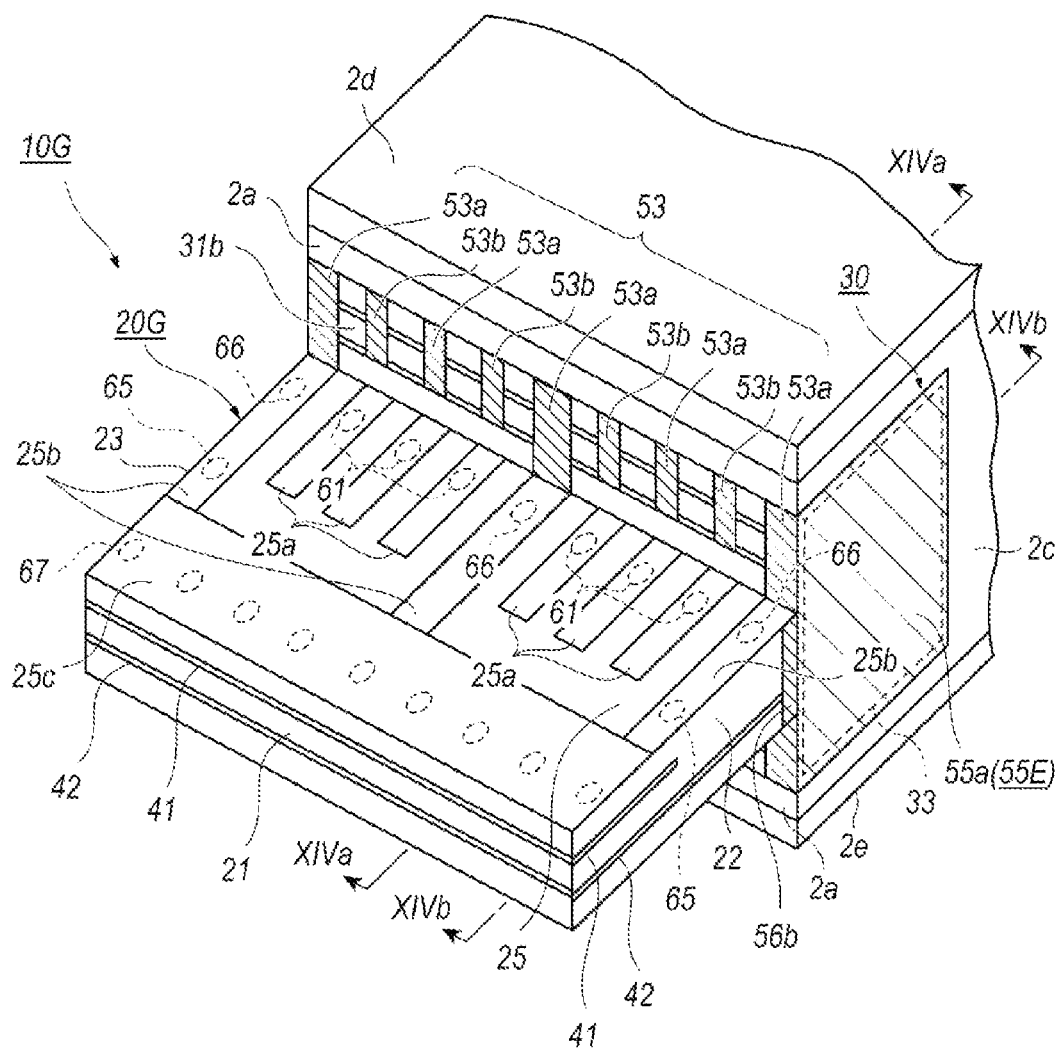
FIG. 13 is a perspective drawing of still another feedthrough according to the present invention, which is viewed from the rear bottom of the housing.

FIG. 13 is a perspective drawing of still another feedthrough 10G according to the present invention. The feedthrough 10G has a feature distinguishable from those aforementioned modifications, 10 to 10F, that the external portion 20G thereof provides no metal films in the rear face 21 thereof and only one metal films, 56a and 56b, are provided in the respective sides, 22 and 23, of the external portion 20G. The metal films, 56a and 56b, connect the ground lines, 24b and 25b, provided in the outermost sides in the top and back faces, 24 and 25, and are connected with the metal films, 55a and 55b, provided in the respective sides, 32 and 33, of the internal portion 30. Moreover, in the back face 25 of the external portion 20G, the bias lines 25a are terminated in a midway of the back face 25, or in respective ends of the bias lines 25a are retreated from the rear edge of the back face 25. Instead, another ground line 25c extend from one side 22 to the other side 23 along the rear edge of the back face 25 as connecting the ground lines 25b in the respective outermost sides and the center of the back face 25. Thus, the bias lines 25a are surrounded by the ground lines, 25b and 25c.

Figure 14A:
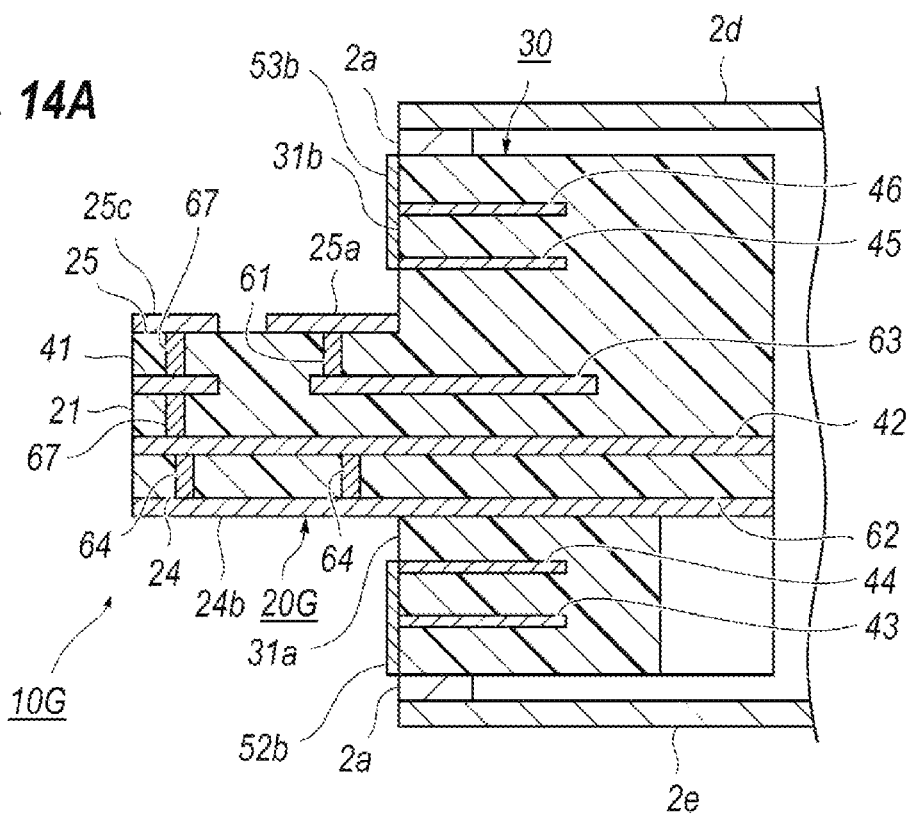
FIG. 14A is a cross sectional view of the feedthrough taken along the line XIVa-XIVa indicated in FIG. 13.
Figure 14B:
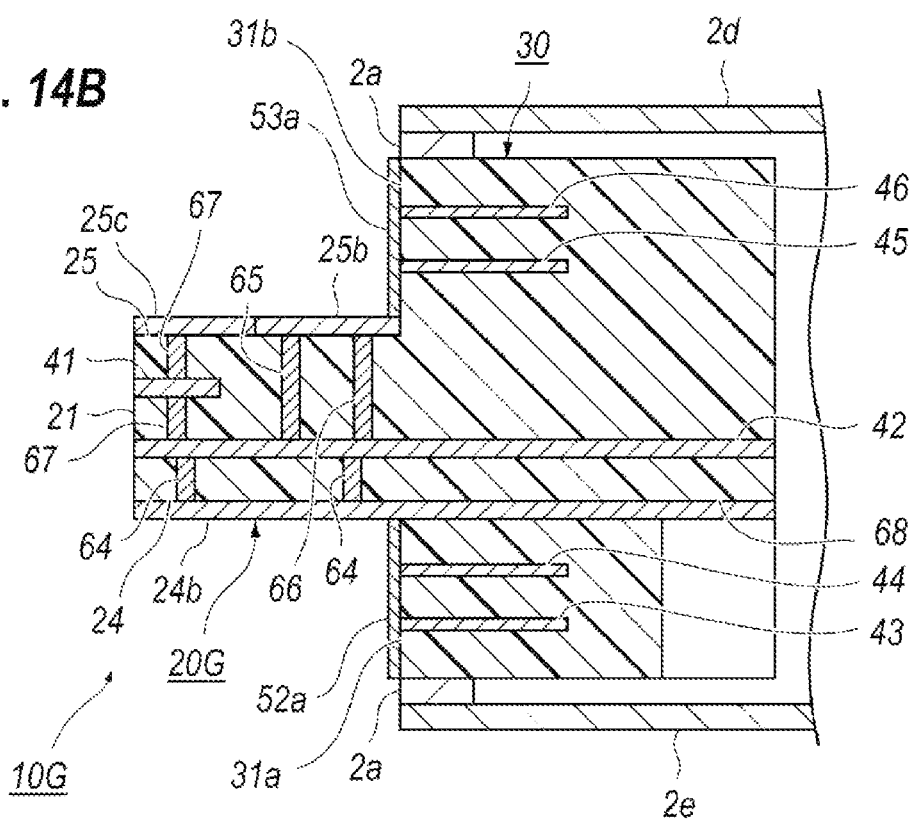
FIG. 14B is also a cross sectional view of the feedthrough but taken along the line XIVb-XIVb indicated in FIG. 13.

The ground line 25c provides vias 67 that connect the ground line 25c with the ground layers, 41 and 42. The vias 67 may be arranged in the ground line 25c with a distance to a neighbor one that is shorter than 1 mm, preferably around 0.5 mm. Other arrangements of the external portion 20G are substantially same with those of the aforementioned arrangement. FIG. 14A is a cross sectional view of the feedthrough 10G that is taken along the line XIVa-XIVa indicated in FIG. 13, and FIG. 14B is also a cross sectional view of the feedthrough 10G but taken along the line XIVb-XIVb indicated in FIG. 13. The bias lines 25a continue with the interconnection 63 within the housing 2 through the vias 61. While, the ground line 25c is connected with the ground layers, 41 and 42, where one of the ground layers 42, which is connected with the ground line 24b in the top face 24 through the vias 64, extends within the internal portion 30. The ground lines 25b are connected with the ground layer 42 through the vias, 65 and 66. Thus, the ground lines, 24b and 25c, and the vias, 64 and 67, may form the meshed ground pattern closer to the rear face 21 of the external portion 20G.

The present invention thus described is not restricted to the embodiment and modifications thereof, and may include further various modifications and changes. For instance, the embodiment and the modifications thereof divide the signal lines from the bias lines; that is, the top face of the external portion provides the signal lines as the transmission lines, while, the back face thereof provides only the bias lines. However, a feedthrough may provide signal lines and bias lines in a same face. Also, the embodiment and the modifications thereof provide the transmission lines of the differential configuration, that is, two signal lines with the co-planar arrangement that are put between the ground lines as the micro-strip line. However, the transmission lines are not inevitably configured with the differential arrangement. A transmission line with the mono-phase arrangement, that is, one signal line put between ground lines, may be implemented within a feedthrough. Accordingly, the present invention should be considered to provide a scope defined in claims attached hereto and equivalent thereto.

What is claimed is:

1. An optical module comprising:
    a housing that encloses a semiconductor optical device therein, the housing having electrically conductive walls including a rear wall and a pair of side walls each extending from the rear wall; and
    a feedthrough provided in the rear wall of the housing, the feedthrough including;
        an internal portion having an upper rear face and a lower rear face, and
        an external portion each made of electrically insulating materials protruding from the upper rear face and the lower rear face of the internal portion outwardly and having a top face, a back face, a rear face, and a pair of side faces, the top face being continuous to the upper rear face of the internal portion, the back face being continuous to the lower rear face of the internal portion, the rear face and the side faces connecting the top face with the back face, the top face including transmission lines comprising signal lines and ground lines, the transmission lines carrying high frequency signals for the semiconductor optical device, the back face of the external portion including ground lines,
    wherein at least one of the upper rear face, the lower rear face each provided in the internal portion, and the rear face of the external portion has a shield structure.

2. The optical module according to claim 1,
wherein the side faces of the external portion each have shield structures including ground layers and metal films, the ground layers extending from the respective side faces within the external portion, the metal films connecting one of the ground lines in the top face with one of the ground lines in the back face, the ground layers and the metal films forming meshed ground patterns in the respective side faces of the external portion.

3. The optical module according to claim 2,
wherein the side faces in the internal portion provides shield structure including metal films each connected with the metal films in the respective sides of the external portion.

4. The optical module according to claim 1,
wherein the rear face of the external portion provides the shield structure that includes ground layers and metal films, the ground layers extending from the rear face within the external portion, at least one of the ground layers extending into the internal portion, the metal films connecting the ground layers.

5. The optical module according to claim 4,
wherein the metal films connect the ground lines in the top face of the external portion with the ground lines in the back face of the external portion, the metal films and the ground layers forming a meshed ground pattern in the rear face of the external portion.

6. The optical module according to claim 4,
wherein the ground lines in the top face and the ground lines in the back face are connected with the ground layers through respective vias.

7. The optical module according to claim 1,
wherein the upper rear face of the internal portion provides the shield structure including ground layers and metal films, the ground layers extending within the internal portion, the metal films connecting the ground layers.

8. The optical module according to claim 7,
wherein the metal films connect the ground layers with the ground lines in the top face of the external portion, the metal films and the ground layers forming a meshed ground pattern in the upper rear face.

9. The optical module according to claim 7,
wherein the metal films provided in respective outermost sides in the upper rear face are connected with the ground lines in the top face of the external portion and the metal films provided inward are apart from the top face of the external portion.

10. The optical module according to claim 1,
wherein the lower rear face of the internal portion provides the shield structure including ground layers and metal films, the ground layers extending within the internal portion, the metal films connecting the ground layers.

11. The optical module according to claim 10,
wherein the metal films further connect the ground layers with the ground lines in the back face of the external portion, the metal films and the ground layers forming a meshed ground pattern in the lower rear face.

12. The optical module according to claim 10,
wherein the metal films provided in respective outermost sides in the lower rear face are connected with the ground lines in the back face of the external portion and the metal films provided inward are apart from the back face of the external portion.

13. The optical module according to claim 1,
wherein the back face of the external portion further provides bias lines that carry biases to the semiconductor optical device.

* * * * *